Sept. 2, 1952 H. B. LAW 2,609,428
BASE ELECTRODES FOR SEMICONDUCTOR DEVICES
Filed Aug. 31, 1949
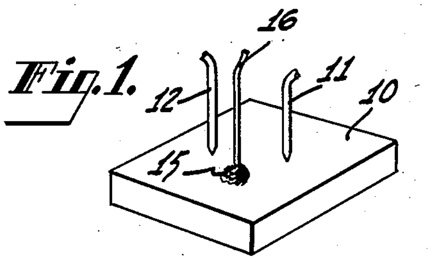
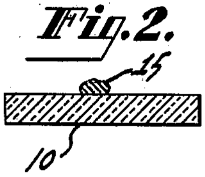
FIG. 2.
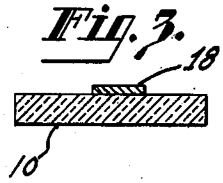
FIG. 3.
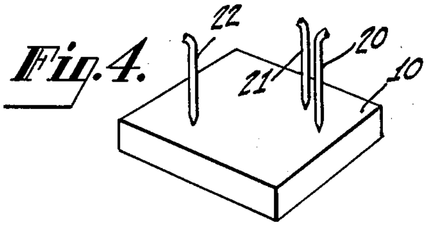
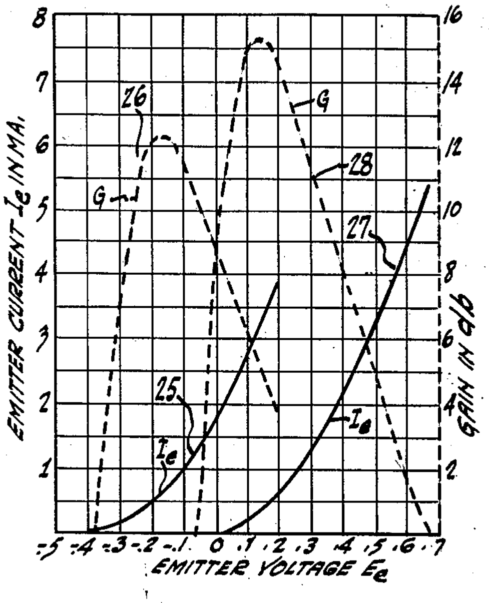
FIG. 5.
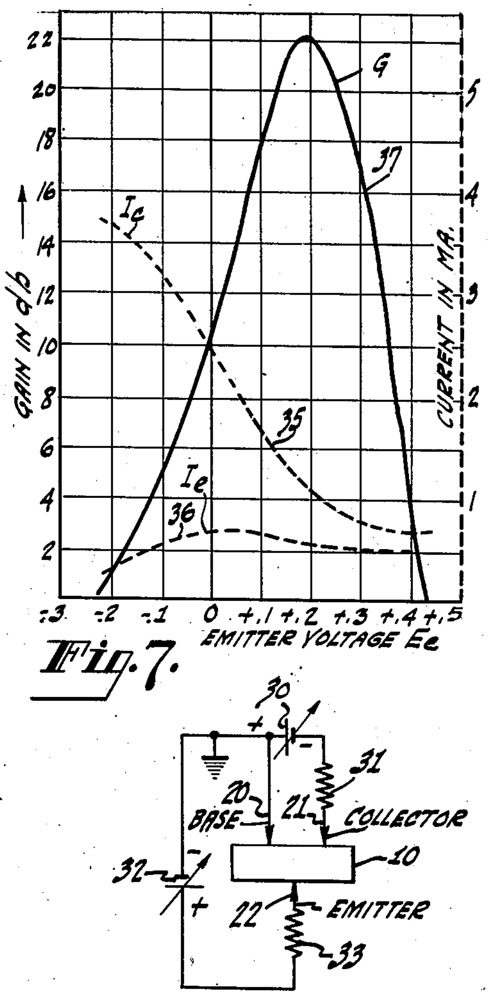
FIG. 7, FIG. 6
Inventor
HAROLD B. LAW
By
H. O. Newton
Attorney Patented Sept. 2, 1952

2,609,428

UNITED STATES PATENT OFFICE 2,609,428

BASE ELECTRODES FOR SEMICONDUCTOR DEVICES

Harold B. Law, Princeton, N. J., assignor to Radio Corporation of America, a corporation of Delaware Application August 31, 1949, Serial No. 113,283

11 Claims. (Cl. 175—366)

This invention relates generally to semi-conductor devices suitable as amplifiers or oscillators, and particularly relates to novel base electrodes for such devices.

The three-electrode semi-conductor has recently been developed as an amplifier or oscillator. This device, which has been termed a "transistor," has been disclosed in a series of three letters to the Physical Review by Bardeen and Brattain, Brattain and Bardeen, and Shockley and Pearson which appear on pages 230 to 233 of the July 15, 1948 issue. The new amplifier includes a block of a semi-conducting material such as silicon or germanium which is provided with two closely adjacent point electrodes called "emitter" and "collector" electrodes in contact with one surface region of the material, and a "base" electrode which provides large-area, low-resistance contacts with another surface region of the semi-conducting material. This amplifier provides voltage as well as current gain under proper operating conditions and may be considered as a three-terminal network having a common input and output terminal. Thus, the device is effectively a four-terminal network having a common input and output electrode which may, for example, be the base electrode.

It is usually assumed that a two-electrode crystal rectifier requires a small-area or point electrode and another electrode which contacts the bulk of the crystal and is of such large area that its resistance is extremely low for either direction of current flow. Accordingly, non-linear effects at this large-area electrode are not of great significance compared to those at the point electrode having a very small area which may be obtained by a wire having a sharp point. The actual rectification takes place at a hypothetical barrier layer at the surface of the crystal near the point electrode. Such a crystal rectifier made of an N type semi-conductor will conduct readily when the point electrode is positive in polarity and is relatively non-conducting when the point electrode is made negative. For a two-electrode rectifier made of a P type semi-conducting crystal the situation is reversed.

By analogy it has generally been assumed that the base electrode of a three-electrode semi-conductor amplifier must be of large area, must have a comparatively low contact resistance and must be non-rectifying. In accordance with the present invention it has been found that the base electrode need not have a comparatively large contact area but that its contact area may be of substantially the same size as that of the emitter and collector electrodes which are point electrodes. Such a small-area base electrode makes it possible to provide all three electrodes of a semi-conductor amplifier on the same surface of the crystal. This will facilitate the manufacture of the device and will also improve its high-frequency response due to the reduced transit time of the charge carriers flowing between any two of its electrodes. Such an arrangement has the same effect as if the device had a very small semi-conducting crystal.

It is the principal object of the present invention therefore to provide novel base electrodes for semi-conductor devices suitable as amplifiers, oscillators or the like.

Another object of the invention is to provide a base electrode for a semi-conductor amplifier or oscillator which has a small contact area with the crystal comparable to that of the emitter and collector electrodes which are rectifying electrodes, whereby the three electrodes of the device may be provided on the same surface of the semi-conducting crystal.

A further object of the invention is to provide a novel process of preparing a low-resistance, non-rectifying electrode contacting a surface of a semi-conducting crystal.

A semi-conductor amplifier or oscillator in accordance with the present invention comprises a plurality of electrodes including the base electrode and having contact areas with the semi-conducting crystal of substantially equal size. Thus, the base electrode may consist of a drop of solder or it may consist of an electrodeposited layer of metal having a small contact area with the crystal. The base electrode in this case will have a low-resistance contact with the crystal in spite of its small size.

Alternatively, the base electrode may consist of a pointed wire which normally has a relatively high contact resistance with the crystal. Thus, all three electrodes of the device may consist of high-resistance electrodes. One of the three point electrodes may be spaced from the other two electrodes, and the amplifier may be operated so that this remote electrode becomes either the emitter or the base electrode.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a view in perspective of a three-electrode semi-conductor device having a small-area base electrode and embodying the present invention;

Figure 2 is a sectional view of the base electrode and semi-conductor crystal of Figure 1;

Figure 3 is a sectional view of a modified base electrode and semi-conductor crystal in accordance with the invention;

Figure 4 is a view in perspective of a semi-conductor device having three point electrodes and embodying the present invention;

Figure 5 is a graph illustrating the performance of a semi-conductor device having a soldered base electrode compared to that of a device having a point base electrode;

Figure 6 is a schematic circuit diagram of a semi-conductor amplifier referred to in explaining the operation of the device of Figure 4; and Figure 7 is a graph illustrating current vs. voltage curves as well as the gain of the device of Figure 4.

Referring now to the drawing in which like components have been designated by the same reference numerals throughout the figures, and particularly to Figures 1 and 2, there is illustrated a semi-conductor device embodying the present invention which may be used as an amplifier, oscillator or the like. The device comprises a block 10 of semi-conducting material consisting, for example, essentially of a chemical element having semi-conducting properties such as germanium, silicon, boron, tellurium, or selenium containing a small but sufficient number of atomic impurity centers or lattice imperfections as commonly employed for best results in crystal rectifiers. Germanium is the preferred material for block 10 and may be prepared so as to be an electronic N type semi-conductor crystal as is well known. The top surface of semi-conducting block 10 may be polished and etched in the manner explained in the paper by Bardeen and Brattain referred to. It is also feasible to utilize the germanium block from a commercial high-back voltage germanium rectifier such as the type 1N34.

The device of Figures 1 and 2 is provided with two point electrodes 11 and 12 which may be arranged or biased to be the emitter electrode and the collector electrode, respectively, of the device. Emitter electrode 11 and collector electrode 12 may, for example, consist of a small-diameter wire of tungsten or phosphor bronze having a pointed end as shown. The contact areas of electrodes 11 and 12 are extremely small compared to the entire surface area of block 10. Thus, the diameter of the contact area of electrodes 11 and 12 may be of the order of 1 mil or less.

In accordance with the present invention base electrode 15 is a low-resistance, small-area electrode which is non-rectifying. Thus, base electrode 15 may be provided by fusing a drop of solder of a diameter of the order of 4 to 6 mils with the surface of germanium block 10 by means of solder flux. As illustrated in Figure 2 the drop of solder is somewhat flat or oval shaped due to the surface tension between the crystal surface and the solder. A solder suitable for base electrode 15 may, for example, have equal parts of tin and lead. Any type of solder may be used for this purpose including Wood's metal which consists of 50 parts by weight of bismuth, 25 parts of lead, 12½ parts of tin and 12½ parts of cadmium. This type of solder has a melting point of 65.5 degrees centigrade.

The contact area of base electrode 15 is approximately 200 times smaller than the area of a conventional base electrode connected to a crystal which may have a square surface 45 mils long and wide. Nevertheless, the contact resistance of electrode 15 was found to be very low. Electrode 15 accordingly is a small-area, low-resistance, non-rectifying electrode.

The three electrodes 11, 12 and 15, preferably are provided on the same surface of crystal 10 as illustrated in Figure 1. Furthermore, the distances between the three electrodes 11, 12 and 15 may be approximately equal and the electrodes may be arranged at the apices of an equilateral triangle as shown in Figure 1.

At the present time it is not possible to explain in detail the non-rectifying properties of a small-area solder electrode such as shown at 15. However, it is believed that the solder diffuses into the topmost layer of germanium block 10. Consequently, no barrier layer exists between crystal 10 and electrode 15 so that the electrode is a non-rectifying electrode. Due to the low contact resistance between electrode 15 and the crystal block 10 the potential of the bulk of crystal will be that of electrode 15. In other words, the resistance of electrode 15 should be low enough to control the crystal potential.

Electric contact may be made to solder electrode 15 by a thin wire such as shown at 16 in Figure 1. This wire may easily be connected or soldered to the solder drop 15. It is also feasible to provide more than one base electrode such as shown at 15 in Figure 1.

In accordance with the present invention it has also been found that a low-resistance, non-rectifying electrode may be provided by electrodepositing a layer of a suitable metal on a surface of crystal 10. Such an electrodeposited or electroplated layer is illustrated at 18 in Figure 3. This may be accomplished as follows. Crystal 10 is first polished and etched in the conventional manner. Thereafter, the crystal is imbedded in wax except for a portion of the surface which it is desired to electroplate. This area preferably has approximately the same size as the contact area of solder drop 15, that is, it may have a diameter of approximately 4 to 6 mils. The crystal is now immersed in an aqueous solution containing 3.0 ounces of copper cyanide, 4.5 ounces of sodium cyanide and 2.0 ounces of sodium carbonate per gallon of water. The crystal is made the cathode and a copper anode is placed into the bath. Electric current is allowed to flow between these two electrodes for a very short period of time of the order of 10 seconds whereby a portion of the copper in the bath is deposited on the wax-free surface area of crystal 10.

The thus obtained deposit of copper has a very fine grain and the layer shows the typical bright color of a thin copper deposit. The thus obtained electrode is non-rectifying and has a low contact resistance. At the present time it is not too well understood why such an electrodeposited layer should form a low-resistance, non-rectifying electrode. However, it is believed that the cyanide bath may attack the previously etched surface of the crystal and presumably the copper either diffuses into the crystal or forms a very intimate bond therewith. In any case, the contact resistance of electrodeposited layer 18 as measured between a point electrode and layer 18 or between a conventional base electrode and layer 18 was found to be very low. The geometric arrangement of the three electrodes of a semi-conductor amplifier or oscillator may again be that illustrated in Figure 1 with the exception that solder drop 15 is replaced by electrodeposited layer 18 of Figure 3. Layer 18 may be connected to a fine wire in the manner previously explained.

In accordance with the present invention it has been found that under certain operating conditions the base electrode need not even be a low-resistance, non-rectifying electrode. In other words, the base electrode may be a small-area electrode which normally has a high contact resistance with the semi-conductor crystal. Such a device in accordance with the present invention is illustrated in Figure 4. Semi-conductor block 10 is provided with three point electrodes 20, 21 and 22. The three point electrodes may consist of thin wires of tungsten or phosphor bronze, for example, and may either have a pointed end as illustrated in Figure 4 or they may have a comparatively blunt end. Electrodes 20 to 22 accordingly have a relatively small contact area with crystal 10 and are ordinarily rectifying electrodes. Electrodes 20 and 21 may have a spacing of the order of 2 mils. As illustrated in Figure 4, electrode 22 is relatively remote from electrodes 20 and 21 and may be spaced therefrom between approximately 20 and 25 mils. However, it is to be understood that all three electrodes 20, 21 and 22 may be closely spaced to improve the high frequency response of the device.

In accordance with the present invention it has been found that the device illustrated in Figure 4 will show an appreciable gain if electrode 22 is made the base electrode while electrodes 20 and 21 are respectively emitter and collector electrodes. However, the gain which may be realized with the device of Figure 4 is not as high as that which may be obtained with the device of Figure 1. Furthermore, in accordance with this invention an amplifier having appreciable gain is obtained if electrode 22 is made the emitter electrode while electrodes 20 and 21 may be the base and collector electrodes respectively. However, no gain is obtained if electrode 22 is made the collector electrode while electrodes 20 and 21 are the base and emitter electrodes respectively.

Let it be assumed that electrode 22 is the base electrode while electrode 20 is the emitter electrode and electrode 21 is the collector electrode. For operation as an amplifier it is conventional practice to provide a comparatively small forward bias voltage between the base and emitter electrodes while a comparatively large reverse bias voltage is impressed between the collector and base electrodes. Accordingly, the base electrode 22 is biased in the forward direction with respect to the collector electrode 21. This simply means that base electrode 22 is biased in such a manner as to have a relatively low contact resistance compared to that of the collector electrode 21. Emitter electrode 20 is then also biased in a forward direction and accordingly also has a relatively low contact resistance compared to that of collector electrode 21. This is true as long as a net positive current flows through base electrode 22 into crystal 10. Since a positive current flows from collector electrode 21 to base electrode 22 while a positive current flows from base electrode 22 to emitter electrode 20, a net positive current will flow into base electrode 22 as long as the collector current is larger than the emitter current which corresponds to the normal operating conditions of the device.

Accordingly, it is believed that under these conditions the contact resistance of base electrode 22 will be relatively low and the device will function with a low-resistance, small-area base electrode. It has also been found that the resistance looking into base electrode 22 is approximately at its normal low value when the collector current is a maximum. However, as the emitter current increases the internal base resistance also increases and may approach 7,000 ohms.

Curve 25 of Figure 5 illustrates the emitter current $I_e$ plotted against the emitter voltage $E_e$ for the device of Figure 4. The gain G in db (decibel) is illustrated by dotted curve 26. Curve 27 of Figure 5 illustrates the emitter current $I_e$ plotted against the emitter voltage $E_e$ for a device having a soldered base such as shown at 15 in Figure 1. Curve 28 shown in dotted lines, illustrates the gain of a device having a solder base. It will readily be seen that curves 25 and 27 are parallel. This indicates that the internal base resistance is approximately equal in the two cases because otherwise the curves would diverge. Curves 25 and 27 are shifted by an amount corresponding to .36 volt which represent a contact potential difference which acts to oppose the voltage source provided between emitter electrode 20 and base electrode 22.

Let it now be assumed that in the device of Figure 4, electrode 22 is made the emitter electrode while electrode 20 is the base electrode and electrode 21 the collector electrode. The device of Figure 4 has been illustrated schematically in Figure 6 as an amplifier with three point electrodes. Emitter electrode 22 has been shown in Figure 6 connected to a surface of crystal 10 which is opposite that to which collector electrode 20 and base electrode 21 are connected. This is intended to indicate schematically that emitter electrode 22 is relatively remote from collector electrode 20 and base electrode 21. It is to be understood, however, that all three electrodes 20, 21 and 22 are preferably arranged on the same surface of crystal 10 as shown in Figure 4.

In the circuit of Figure 6 battery 30 has its positive terminal connected to base electrode 20 while its negative terminal is connected to collector electrode 21 through resistor 31 indicating schematically a load impedance element. Battery 30 is accordingly connected in such a polarity as to apply a comparatively large reverse bias between collector electrode 21 and base electrode 20. Battery 30 has been indicated to be variable and its positive terminal may be grounded as shown. Battery 32 has its negative terminal connected to base electrode 20 while its positive terminal is connected through resistor 33 to emitter electrode 22. Battery 32 which has also been shown to be variable, is connected to apply a comparatively small forward bias between base electrode 20 and emitter electrode 22.

The operation of the amplifier indicated in Figure 6 is not clearly understood at the present time. However, it is believed that due to the applied bias voltages the contact resistance of emitter electrode 22 and that of the base electrode 20 are relatively low compared to the contact resistance of collector electrode 21. It is further believed that base electrode 20, which is relatively close to collector electrode 21, will emit holes which flow through crystal 10 to collector electrode 21 where they are collected. It is assumed that this mode of operation is predicated on the fact that base electrode 20 has a contact resistance which is not negligible. In other words, base electrode 20 does not appear to control the potential of the crystal because presumably, if it did, it would normally not be able to emit holes. It is accordingly believed at the present time that the amplifier of Figure 6 functions due to the fact that base electrode 20 will emit holes and therefore effectively functions as an emitter electrode.

Since a semi-conductor amplifier having an N type semi-conducting material functions by reason of the fact that holes are emitted by the emitter electrode and collected by the collector electrode it can readily be seen why the device cannot operate if the remote electrode 22 is made the collector electrode. This is so because the holes will only travel over a relatively short distance of the order of a few mils and cannot be collected by a collector electrode remote from either the emitter electrode or from an electrode which effectively emits holes.

Curve 35 of Figure 7 illustrates the collector current $I_c$ plotted against emitter voltage $E_e$ for the amplifier of Figure 6. Curve 36 shows the emitter current $I_e$ plotted against the emitter voltage $E_e$ while curve 37 indicates the gain as a function of the emitter voltage $E_e$. The gain has a maximum at $E_e=+.2$ volts. When the emitter voltage is approximately +.4 volt the collector current $I_c$ is comparatively small but larger than the emitter current $I_e$. This seems to indicate that electrons are leaving and holes arriving at collector electrode 21. As $E_e$ decreases towards zero the hole emission presumably increases and consequently more electrons leave collector electrode 21. Hence, both $I_c$ and $I_e$ increase. As the emitter electrode 22 becomes negative the electron current $I_e$ begins to decrease but the hole emission continues to increase as evidenced by curve 35. Curves 35 and 36 can be replotted against the voltage of electrode 20 taken with respect to the voltage of electrode 22. In that case the difference between curves 35 ($I_c$) and 36 ($I_e$) which represents the base current will be similar to curve 27 in Figure 5.

A semi-conductor device having three point electrodes has the advantage of simplified construction. Furthermore, all three electrodes may be provided on the same surface of the crystal which will improve the high frequency response of the device particularly if the three electrodes are close to each other.

There has thus been disclosed a semi-conductor device suitable as an amplifier, oscillator or the like having novel base electrodes. The base electrode in accordance with the invention is a small-area electrode which may have a low contact resistance and may be a non-rectifying electrode. Such a base electrode may be provided by a drop of solder or by electrodepositing a small-area metallic layer on the crystal. Alternatively, the base electrode may under certain conditions be a point contact which is normally a high-resistance, rectifying electrode.

What is claimed is:

1. A semi-conductor amplifier or oscillator device comprising a semi-conducting body, and a plurality of electrodes in contact with said body, one of said electrodes being the base electrode, said base electrode having a contact resistance with said body which is lower than that of the other ones of said electrodes, whereby said base electrode controls the potential of the bulk of said body, the contact areas of said electrodes with said body having substantially equal size.

2. A semi-conductor amplifier or oscillator device comprising a semi-conducting body, and three electrodes only in contact with said body, one of said electrodes being the base electrode, the contact areas of said electrodes with said body having substantially equal size.

3. A semi-conductor amplifier or oscillator device consisting of a semi-conducting body having a substantially flat surface, and three substantially equally spaced electrodes only in contact with said surface, one of said electrodes being the base electrode, the contact areas of said electrodes with said surface being substantially equal in size.

4. A semi-conductor device suitable as an amplifier or oscillator and consisting of a semi-conducting body, an emitter electrode, a collector electrode and a base electrode in contact with said body, the contact areas of said electrodes with said body being substantially equal and small compared to the surface area of said body.

5. A semi-conductor device suitable as an amplifier or oscillator and consisting of a semi-conducting body having a substantially flat surface, an emitter electrode, a collector electrode and a base electrode in contact with said surface, the contact areas of said electrodes with said surface being substantially equal and small compared to the area of said surface.

6. A semi-conductor device suitable as an amplifier or oscillator and comprising a semi-conducting body, and three point electrodes including a base electrode in contact with said body, one of said electrodes being remote from the other two electrodes, said other two electrodes being located relatively close to each other, the contact areas of said electrodes with said body being of substantially equal size.

7. A semi-conductor amplifier or oscillator device comprising a semi-conducting body, and three point electrodes in contact with said body, one of said electrodes being remote from the other two electrodes, said remote electrode being the base electrode, the contact areas of said electrodes with said body having substantially equal size.

8. A semi-conductor amplifier or oscillator device comprising a semi-conducting body, and three point electrodes in contact with said body, one of said electrodes being remote from the other two electrodes, said remote electrode being the emitter electrode, the contact areas of said electrodes with said body being of substantially equal size.

9. A semi-conductor amplifier or oscillator device comprising a semi-conducting body, two rectifying high-resistance electrodes in contact with said body, and a non-rectifying low-resistance electrode in small-area contact with said body, said non-rectifying electrode consisting of solder, the contact areas of said electrodes being substantially equal.

10. A semi-conductor device comprising a semi-conducting body, a non-rectifying electrode in contact with said body, said electrode consisting of an electrodeposited metallic layer having a contact area with said body which is small compared to the surface area of said body, and two further electrodes in rectifying contact with said body, the contact areas of said electrodes with said body being substantially equal.

11. A semi-conductor amplifier or oscillator device comprising a semi-conducting body, two rectifying high-resistance electrodes in contact with said body, and a non-rectifying electrode in contact with said body, said non-rectifying electrode consisting of an electrodeposited metallic layer having a relatively low contact resistance, the contact areas of said electrodes being substantially equal, and said electrodes being disposed with substantially equal spacing from each other.

HAROLD B. LAW.

REFERENCES CITED

The following references are of record in the file of this patent:

UNITED STATES PATENTS

| Number | Name | Date |
|---|---|---|
| 1,949,383 | Weber | Feb. 27, 1934 |
| 2,476,323 | Rack | July 19, 1949 |
| 2,503,479 | Pearson et al. | Apr. 4, 1950 |
| 2,553,491 | Shockley | May 15, 1951 |
| 2,560,594 | Pearson | July 17, 1951 |

FOREIGN PATENTS

| Number | Country | Date |
|---|---|---|
| 572,138 | Great Britain | Sept. 25, 1945 |